US012683559B2

(12) United States Patent
Adnan et al.

(10) Patent No.: US 12,683,559 B2
(45) Date of Patent: Jul. 14, 2026

(54) RADIO-FREQUENCY CIRCUITRY WITH SHAPABLE DIFFERENTIAL COUPLED LINES FOR LOW-LOSS IMPEDANCE MATCHING

(71) Applicant: Apple Inc., Cupertino, CA (US)

(72) Inventors: Muhammad Adnan, San Jose, CA (US); Abdulrahman A Alhamed, Riyadh (SA); Xiang Guan, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 341 days.

(21) Appl. No.: 18/340,720

(22) Filed: Jun. 23, 2023

(65) Prior Publication Data

US 2024/0088836 A1 Mar. 14, 2024

Related U.S. Application Data

(60) Provisional application No. 63/406,636, filed on Sep. 14, 2022.

(51) Int. Cl.
H03F 1/56 (2006.01)
H03F 3/195 (2006.01)
(Continued)

(52) U.S. Cl.
CPC .............. H03F 1/56 (2013.01); H03F 3/195 (2013.01); H03H 7/38 (2013.01); H04B 1/0458 (2013.01);
(Continued)

(58) Field of Classification Search
CPC . H01P 3/026; H03F 1/56; H03F 1/565; H03F 2200/318; H03F 2200/411;
(Continued)

(56) References Cited

U.S. PATENT DOCUMENTS 6,768,663 B2 7/2004 Ogata
2006/0284698 A1* 12/2006 Vaisanen .................. H03F 3/26
                                                          333/26
(Continued)

FOREIGN PATENT DOCUMENTS

EP          0837559 B1      1/2004
WO     2021061776 A1      4/2021

OTHER PUBLICATIONS

Bingting Wang et al., A Review of Impedance Matching Techniques in Power Line Communications, Electronics 2019, Sep. 12, 2019, pp. 1-26, vol. 8, No. 9, MDPI.
(Continued)

*Primary Examiner* — Nguyen T Vo

(74) *Attorney, Agent, or Firm* — Treyz Law Group; Jason Tsai

(57) ABSTRACT

An electronic device may include wireless circuitry having one or more radio-frequency amplifiers coupled to differential coupled lines. The differential coupled lines may provide routing and impedance matching for the radio-frequency amplifiers with minimal power loss. The differential coupled lines may include a first pair of coupled lines and a second pair of coupled lines. The first pair of coupled lines may include a first conductive routing path coupled to a first voltage line and a second conductive routing path routed along the first conductive routing path and coupled to a second voltage line. The second pair of coupled lines may include a third conductive routing path coupled to the first voltage line and a fourth conductive routing path routed along the third conductive routing path and coupled to the second voltage line.

25 Claims, 8 Drawing Sheets

(51) Int. Cl.
   *H03H 7/38* (2006.01)
   *H04B 1/04* (2006.01)
(52) U.S. Cl.
   CPC .. *H03F 2200/451* (2013.01); *H03F 2200/534*
   (2013.01); *H03F 2200/543* (2013.01)
(58) Field of Classification Search
   CPC ......... H03F 2200/423; H03F 2200/451; H03F
   2200/534; H03F 2200/537; H03F
   2200/543; H03F 2203/45621; H03F
   2203/45731; H03F 3/195; H03F 3/26;
   H03F 3/45475; H03F 3/602; H03H 7/38;
   H04B 1/0458
   See application file for complete search history.

(56) References Cited

U.S. PATENT DOCUMENTS

| | | | | |
|---|---|---|---|---|
| 2014/0253246 A1* | 9/2014 | Mei | ........................... | H03F 1/42 |
| | | | | 330/295 |
| 2017/0026009 A1* | 1/2017 | Xue | .......................... | H03F 3/19 |
| 2023/0073267 A1* | 3/2023 | Mesquita | ............... | H04B 1/581 |
| 2023/0208380 A1* | 6/2023 | Bhat | .................... | H04B 1/0458 |
| | | | | 333/17.3 |
| 2024/0178804 A1* | 5/2024 | Tahara | .................... | H03F 3/195 |
| 2025/0158571 A1* | 5/2025 | Huang | .................... | H03F 1/565 |

OTHER PUBLICATIONS

Jim Karki, Output impedance matching with fully differential operational amplifiers, Analog Applications Journal 1Q, 2009, pp. 29-35, Texas Instruments Incorporated.

Winfried Bakalski et al., "A Fully Integrated 5.3-GHz 2.4-V 0.3-W SiGe Bipolar Power Amplifier With 50 Ohm Output," IEEE Journal of Solid-State Circuits, Jul. 1, 2004, pp. 1006-1014, vol. 39, No. 7, IEEE, USA.

John R. Long, "Monolithic Transformers for Silicon RF IC Design," IEEE Journal of Solid-State Circuits, Sep. 1, 2000, pp. 1368-1382, vol. 35, No. 9, IEEE, USA.

* cited by examiner

FORWARD
POWER
GAIN
(dB)

frequency

RADIO-FREQUENCY CIRCUITRY WITH SHAPABLE DIFFERENTIAL COUPLED LINES FOR LOW-LOSS IMPEDANCE MATCHING

This application claims the benefit of U.S. Provisional Patent Application No. 63/406,636, filed Sep. 14, 2022, which is hereby incorporated by reference herein in its entirety.

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals transmitted by and received at an antenna can be fed through one or more radio-frequency amplifiers. Amplifiers along a transmit chain or a receive chain can be connected together via transformers and transmission lines. The transformers can take up a substantial amount of circuit area while introducing matching loss. Moreover, the transformers can be required to fit in rectangular or square-like areas to maximize their performance, which imposes extra constraints on the overall design.

It is within this context that the embodiments herein arise.

SUMMARY

An electronic device may include wireless communications circuitry. The wireless communications circuitry may include one or more processors or signal processing blocks for generating and receiving baseband (digital) signals, a transceiver having a transmitter for generating corresponding radio-frequency signals based on the baseband signals and having a receiver for generating corresponding baseband signals based on received radio-frequency signals, one or more radio-frequency transmitting amplifiers configured to amplify the radio-frequency signals for transmission by one or more antennas in the electronic device, and one or more radio-frequency receiving amplifiers configured to amplify radio-frequency signals received by one or more antennas in the electronic device. The radio-frequency amplifiers in the wireless circuitry can be connected using differential coupled lines.

An aspect of the disclosure provides circuitry that includes a first amplifier and differential coupled lines. The differential coupled lines can include a first pair of coupled lines connected to a first output terminal of the first amplifier and a second pair of coupled lines connected to a second output terminal of the first amplifier. The first pair of coupled lines can include a first conductive path having a first distal end coupled to the first output terminal of the first amplifier and having a second distal end coupled to a bias voltage line and a second conductive path routed along the first conductive path and having a first distal end coupled to a ground line and having a second distal end. The second pair of coupled lines can include a third conductive path having a first distal end coupled to the second output terminal of the first amplifier and having a second distal end coupled to the bias voltage line and a fourth conductive path routed along the third conductive path and having a first distal end coupled to the ground line and having a second distal end. The first distal end of the first conductive path can directly connected to the first output terminal of the first amplifier and wherein the first distal end of the third conductive path is directly connected to the second output terminal of the first amplifier.

The circuitry can further include a second amplifier configured to receive a signal via the differential coupled lines, a first differential transmission line optionally coupled between the first amplifier and the differential coupled lines, and a second differential transmission line optionally coupled between the differential coupled lines and the second amplifier. The differential coupled lines can be configured to provide impedance matching between the first and second amplifiers. The first and second pair of coupled lines can be edge-coupled strip lines, edge-coupled coplanar waveguides with or without grounding, or a broadside-coupled strip lines.

An aspect of the disclosure provides circuitry that includes a first amplifier and differential coupled lines. The differential coupled lines can include a first pair of coupled lines connected to a first input terminal of the first amplifier, and a second pair of coupled lines connected to a second input terminal of the first amplifier. The first pair of coupled lines can include a first conductive path having a first distal end and having a second distal end coupled to a bias voltage line, and a second conductive path routed along the first conductive path and having a first distal end coupled to a ground line and having a second distal end coupled to the first input terminal of the first amplifier. The second pair of coupled lines can include a third conductive path having a first distal end and having a second distal end coupled to the bias voltage line, and a fourth conductive path routed along the third conductive path and having a first distal end coupled to the ground line and having a second distal end coupled to the second input terminal of the first amplifier.

An aspect of the disclosure provides circuitry that includes a radio-frequency amplifier and differential coupled lines configured to provide impedance matching for the radio-frequency amplifier. The differential coupled lines can include a first conductive routing path coupled between the radio-frequency amplifier and a first voltage line, a second conductive routing path routed in parallel with the first conductive routing path and coupled to a second voltage line different than the first voltage line, a third conductive routing path coupled between the radio-frequency amplifier and the first voltage line, and a fourth conductive routing path routed in parallel with the third conductive routing path and coupled to the second voltage line. The circuitry can further include a differential transmission line coupled between the radio-frequency amplifier and the differential coupled lines. The circuitry can further include a differential transmission line coupled between the differential coupled lines and an additional radio-frequency amplifier configured to receive a radio-frequency signal from the radio-frequency amplifier.

An aspect of the disclosure provides divider circuitry that includes a first amplifier stage, a second amplifier stage having first amplifiers and second amplifiers, a first set of differential coupled lines coupled between the first amplifier stage and the first amplifiers in the second amplifier stage, and a second set of differential coupled lines coupled between the first amplifier stage and the second amplifiers in the second amplifier stage. The divider circuitry can further include third and fourth sets of differential coupled lines coupled to outputs of the first amplifiers in the second amplifier stage, and fifth and sixth sets of differential coupled lines coupled to outputs of the second amplifiers in the second amplifier stage. At least one of the first, second, third, fourth, fifth, and sixth sets of differential coupled lines can include a first conductive routing path coupled to a first voltage line, a second conductive routing path routed along the first conductive routing path and coupled to a second voltage line different than the first voltage line, a third conductive routing path coupled to the first voltage line, and a fourth conductive routing path routed along the third conductive routing path and coupled to the second voltage line.

DETAILED DESCRIPTION

Figure 1:
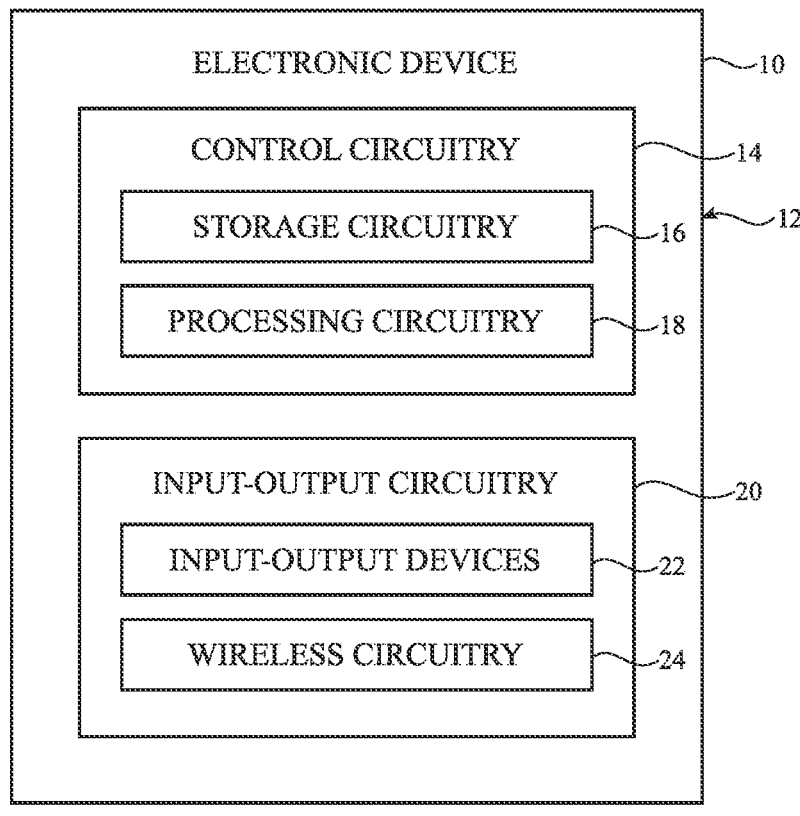
FIG. 1 is a diagram of an illustrative electronic device having wireless circuitry in accordance with some embodiments.

An electronic device such as device 10 of FIG. 1 may be provided with wireless circuitry. The wireless circuitry may include one or more amplifiers configured to amplify radio-frequency signals along a transmit path or a receive path. Differential coupled lines may be used to interconnect one amplifier to another amplifier. Arranged in this way, the differential coupled lines, and optionally additional differential transmission lines, can provide interstage impedance matching and routing between two successive amplifier stages without using any transformers. Differential coupled lines may be used to connect one amplifier to one or more input-output circuits. The term "connect" or "couple" may refer to a direct connection or an indirect connection that includes one or more intervening components. Arranged in this way, the differential coupled lines can provide impedance matching and routing between the amplifier and the input-output circuits without using any transformers. The differential coupled lines may include a first pair of parallel coupled lines and a second pair of parallel coupled lines carrying differential signal. The parallel coupled lines in the first and second pairs of coupled lines can be edge-coupled microstrip lines, broadside-coupled microstrip lines, or other types of coupled microstrip lines. The edge-coupled lines can also be implemented as edge-coupled coplanar waveguides, edge-coupled coplanar waveguides with ground, and edge-coupled grounded coplanar waveguides. Configured and operated in this way, the differential coupled lines can help reduce circuit area while reducing matching loss.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultrawideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
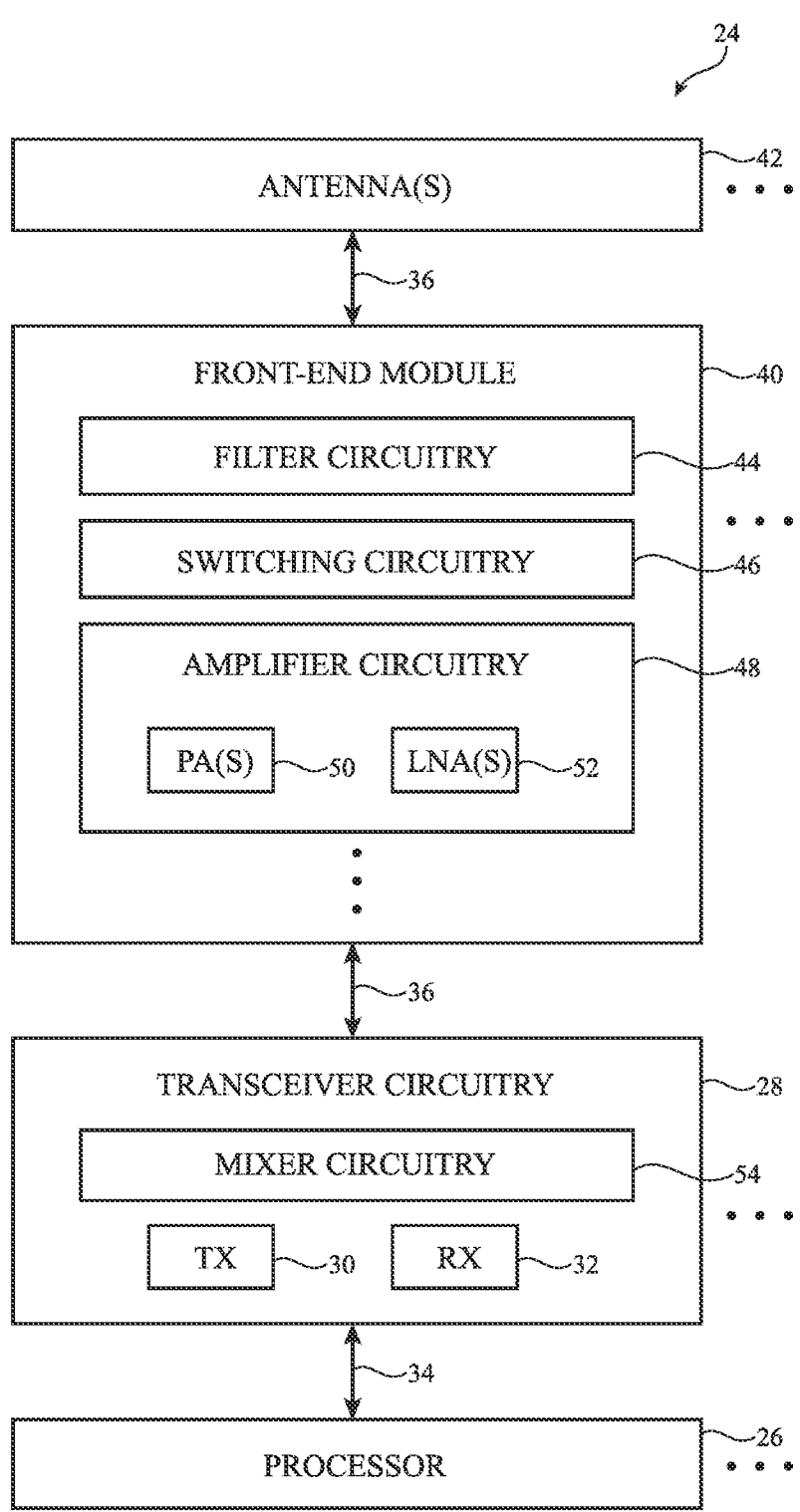
FIG. 2 is a diagram of illustrative wireless circuitry having amplifiers in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 into corresponding radio-frequency signals. For example, transceiver circuitry 28 may include mixer circuitry 54 for up-converting (or modulating) the transmit (baseband) signals to radio frequencies prior to transmission over antenna 42. The example of FIG. 2 in which processor 26 communicates with transceiver 28 is merely illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry 54 for down-converting (or demodulating) the received radio-frequency signals to baseband frequencies prior to conveying the received signals to processor 26 over path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56

MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

It can be challenging to design a radio-frequency transmission line path 36. For instance, consider a scenario in which a radio-frequency amplifier has an output port that is coupled to an additional radio-frequency circuit component such as an antenna or another amplifier. A differential transmission line can be used to couple the radio-frequency amplifier to the additional radio-frequency circuit. To provide impedance matching, one or more transformers can be disposed in the radio-frequency transmission line path. For instance, a transformer can be coupled between the output port of the radio-frequency amplifier and the differential transmission line to provide proper impedance matching between the amplifier and the transmission line. The use of a transformer for impedance matching, however, takes up a significant amount of circuit area while introducing some matching (power) loss. Moreover, the use of a differential transmission line for signal routing can also introduce line (power) loss.

Figure 3:
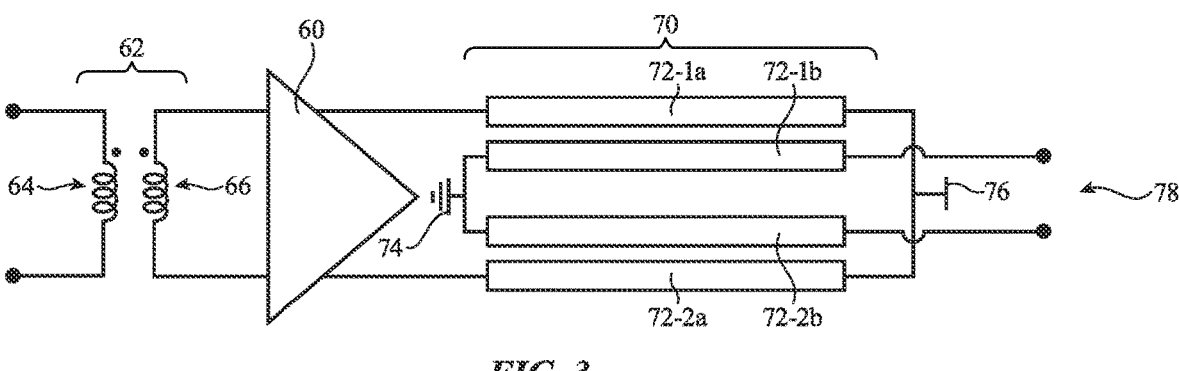
FIG. 3 is a diagram of an illustrative radio-frequency signal path including a transformer coupled to an input of an amplifier and differential coupled lines for output matching in accordance with some embodiments.

In accordance with an embodiment, differential coupled lines can be used to provide both impedance matching and routing functions. The dual purpose of differential coupled lines can obviate the use of impedance matching transformers in a radio-frequency signal path, which can help substantially reduce chip area while minimizing matching/power loss in the radio-frequency signal path. FIG. 3 is a diagram of an illustrative radio-frequency signal path that includes an amplifier 60 coupled to a set of differential coupled lines 70. As shown in FIG. 3, amplifier 60 may have a differential input port coupled to a transformer such as transformer 62 and may have a differential output port coupled to a set of differential coupled lines 70. Amplifier 60 may generally represent a radio-frequency (RF) amplifier such as a power amplifier 50 in a transmit path, a low-noise amplifier 52 in a receive path, and/or other amplifiers within front end module 40 or transceiver circuitry 28. Transformer 62 may include a primary coil (winding) 64 and a secondary coil (winding) 66 coupled to the input port of amplifier 60. Transformer 62 may be used to receive a radio-frequency signal from another circuit within front end module 40 or transceiver 28 and is sometimes referred to as an input coupling transformer 62.

The set of differential coupled lines 70 may be directly coupled (connected) to the differential output port of amplifier 60. Lines 70 may include a first pair of coupled lines 72-1a and 72-1b and a second pair of coupled lines 72-2a and 72-2b. The term "coupled lines" can be referred to and defined herein as at least two elongated conductive lines that are capacitive and magnetically coupled to one another. Line 72-1a may be a conductive routing path having a first terminal (a first distal end) coupled to a first output terminal of amplifier 60 and having a second terminal (a second distal end) coupled to a bias voltage line 76. Bias voltage line 76 may receive a positive power supply voltage or some other bias voltage less than or greater than the positive power supply voltage. Line 72-1b may be a conductive routing path having a first terminal (a first distal end) coupled to a ground line 74 (e.g., a ground power supply line on which a ground voltage is provided) and having a second terminal (a second distal end) coupled to output port 78.

Lines 72-1a and 72-1b may be routed parallel to each another. Although drawn as straight lines in the example of FIG. 3, lines 72-1a and 72-1b need not be completely straight and can have one or more turns, can be curved, can be routed vertically and/or horizontally across the surface of an integrated circuit chip, and/or can form a routing path with any desired shape. Lines 72-1a and 72-1b can have the same footprint. Line 72-1b should generally be routed along or follow line 72-1a and therefore has the same or similar length as line 72-1a. The amount of capacitive and magnetic coupling between lines 72-1a and 72-1b should be designed by selecting the spacing between them to satisfy the required impedance transformation between the preceding and succeeding circuitry. Lines 72-1a and 72-1b can be fairly long. As examples, lines 72-1a and 72-1b can each be at least 50 microns in length, 50-100 microns in length, 100-200 microns in length, 200-400 microns in length, or more than 400 microns long. Conductive lines 72-1a and 72-1b that are routed close to and alongside each other are sometimes referred to collectively and defined as "coupled lines" or a pair of coupled lines that are capacitively and magnetically coupled to one another.

Figure 5:
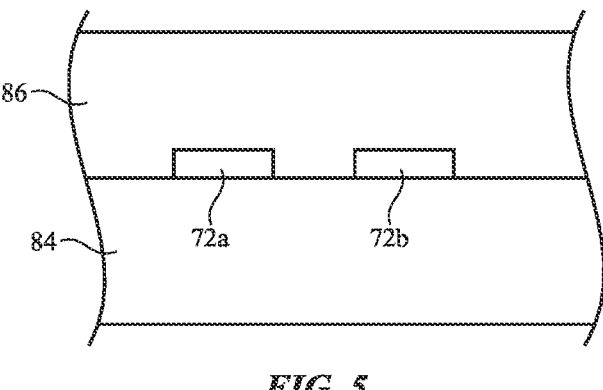
FIG. 5 is a cross-sectional side view of illustrative edge-coupled strip lines in accordance with some embodiments.
Figure 6:
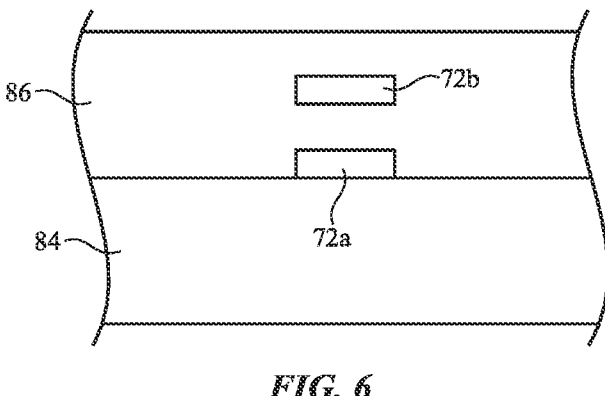
FIG. 6 is a cross-sectional side view of illustrative broadside-coupled strip lines in accordance with some embodiments.

Coupled lines 72-1a and 72-1b may be formed laterally next to each other (as shown in the cross-sectional side view of FIG. 5) or may be formed vertically on top of one another (as shown in the cross-sectional side view of FIG. 6). FIG. 5 illustrates coupled lines 72a and 72b both formed on a semiconductor substrate 84 and cover be dielectric (insulating) material 86. This arrangement in which coupled lines 72a and 72b are formed in the same plane is sometimes referred to as an edge-coupled microstrip configuration. This is illustrative. If desired, the edge-coupled lines can also be implemented as edge-coupled coplanar waveguides, edge-coupled coplanar waveguides with ground, and edge-coupled grounded coplanar waveguides.

FIG. 6 illustrates another arrangement in which line 72b is stacked on top of line 72a (or vice versa). As shown in FIG. 6, line 72a is formed on substrate 84, whereas line 72b is disposed over line 72a within dielectric (insulating) material 86. The example of FIG. 6 in which line 72b is horizontally aligned with line 72a (e.g., line 72b completely overlaps and covers line 72a from above) is illustrative. If desired, line 72b can be partially offset from line 72a such that line 72b only partially overlaps or covers line 72a from above. The arrangement in which coupled lines 72a and 72b are formed in different planes over substrate 84 is sometimes referred to as a broadside-coupled microstrip configuration. If desired, other types of coupled stripline or microstrip line arrangements can be employed.

Line 72-2a may be a conductive routing path having a first terminal (a first distal end) coupled to a second output terminal of amplifier 60 and having a second terminal (a second distal end) coupled to bias voltage line 76. The first and second output terminals of amplifier 60 collectively form the differential output port of amplifier 60. Line 72-2b may be a conductive routing path having a first terminal (a first distal end) coupled to ground line 74 and having a second terminal (a second distal end) coupled to output port 78. Output port 78 (e.g., a differential interface) may be coupled to an interface to another integrated circuit chip, an antenna, or some other load component.

Lines 72-2a and 72-2b may be routed parallel to each another. Although drawn as straight lines in the example of FIG. 3, lines 72-2a and 72-2b need not be completely straight and can have one or more turns, can be curved, can be routed vertically and/or horizontally across the surface of an integrated circuit chip, and/or can form a routing path with any desired shape. Lines 72-2a and 72-2b can have the same footprint. Line 72-2b should generally be routed along or follow line 72-2a and therefore has the same or similar length as line 72-2a. The amount of capacitive and magnetic coupling between lines 72-2a and 72-2b should be designed by selecting the spacing between them to satisfy the required impedance transformation requirement between the precedent and subsequent circuitry.

Lines 72-2a and 72-2b can be fairly long. As examples, lines 72-2a and 72-2b can each be at least 50 microns in length, 50-100 microns in length, 100-200 microns in length, 200-400 microns in length, or more than 400 microns long. Conductive lines 72-2a and 72-2b that are routed close to and alongside each other are sometimes referred to collectively and defined as "coupled lines" or a pair of coupled lines that are capacitively and magnetically coupled to one another. Coupled lines 72-2a and 72-2b may be edge-coupled strip lines (see, e.g., FIG. 5), broadside-coupled strip lines (see, e.g., FIG. 6), coplanar waveguides, coplanar waveguides with ground, grounded coplanar waveguides, or other types of coupled lines. To maintain proper balance of a differential signal being routed through differential coupled lines 70, the first pair of coupled lines 72-1a and 72-1b and the second pair of coupled lines 72-2a and 72-2b should generally be routed in the same way in the same direction (e.g., in a symmetrical manner).

As described above, the first pair of coupled lines 72-1a and 72-1b and the second pair of coupled lines 72-2a and 72-2b can be referred to collectively and defined as differential coupled lines 70. Differential coupled lines 70 can not only be used to provide routing but can also be used to provide impedance matching. For example, consider a scenario in which output port 78 is connected to a 100 Ohm load. In such scenario, differential coupled lines 70 can be designed and configured (e.g., by selecting the length, width, shape, footprint, and other physical characteristics of the coupled lines) to match the impedance of the output port of amplifier 60 to the 100 Ohm load. Using only differential coupled lines 70 to provide an impedance matching function obviates the need for a separate output transformer, which can dramatically reduce circuit area that would otherwise be occupied by the output transformer while also minimizing matching/power loss through the radio-frequency signal path. This example of using differential coupled lines 70 to match to a 100 Ohm load is illustrative. In general, differential coupled lines 70 can be used to provide impedance matching to a 50 Ohm load, to a 75 Ohm load, to a 25 Ohm load, other resistive loads, or other types of output components.

Figure 4:
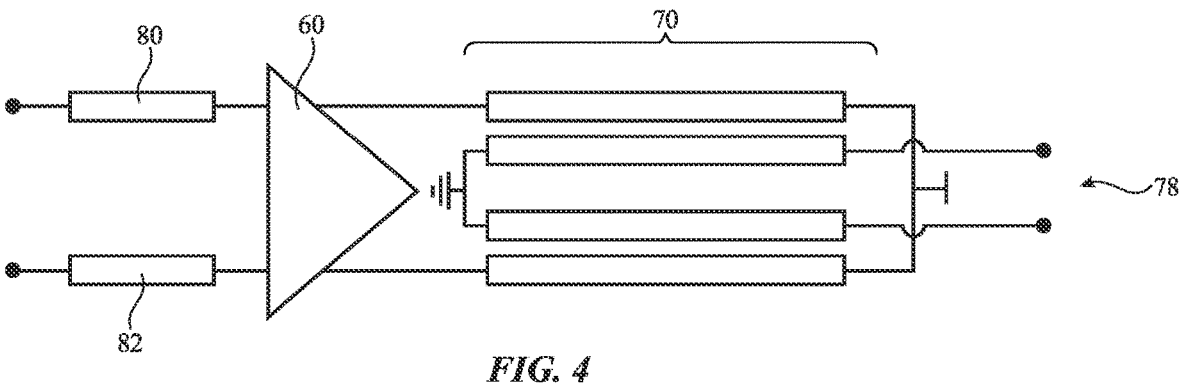
FIG. 4 is a diagram of an illustrative radio-frequency signal path including a transmission line coupled to an input of an amplifier and differential coupled lines for output matching in accordance with some embodiments.

The example of FIG. 4 in which amplifier 60 has a differential input port coupled to a transformer 62 and a differential output port coupled to differential coupled lines 70 is illustrative. FIG. 4 illustrates another embodiment in which amplifier 60 has a differential input port coupled to differential transmission lines 80 and 82 and a differential output port coupled to differential coupled lines 70. As shown in FIG. 4, amplifier 60 has a first input terminal coupled to conductive line 80 and has a second input terminal coupled to conductive line 82. Conductive lines 80 and 82 may collectively form a differential transmission line path. In other words, amplifier 60 can have an input configured to receive radio-frequency signals via a transformer (as shown in the embodiment of FIG. 3) or via a differential transmission line path (as shown in the embodiment of FIG. 4).

Figure 7:
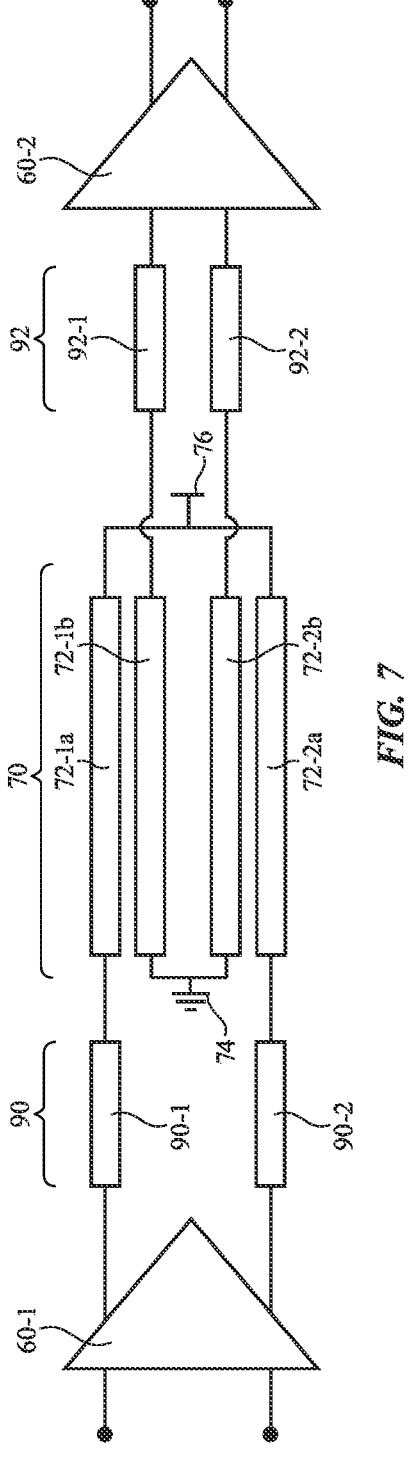
FIG. 7 is a diagram of an illustrative radio-frequency signal path including a first amplifier, a second amplifier, and differential coupled lines for providing interstage matching between the first and second amplifiers in accordance with some embodiments.

FIG. 7 shows another embodiment in which a set of differential coupled lines can be used to provide impedance matching between two different amplifiers. As shown in FIG. 7, differential coupled lines 70 can be coupled between a first amplifier 60-1 (sometimes referred to as a first amplifier stage) and a second amplifier 60-2 (sometimes referred to as a second amplifier stage). Both amplifier stages 60-1 and 60-2 can be differential radio-frequency amplifiers. Differential coupled lines 70 may include a first pair of coupled lines 72-1a and 72-1b and a second pair of coupled lines 72-2a and 72-2b.

Line 72-1a may be a conductive routing path having a first terminal (a first distal end) coupled to a first output terminal of amplifier 60-1 via an optional series transmission line 90-1 and having a second terminal (a second distal end) coupled to bias voltage line 76. Bias voltage line 76 may receive a positive power supply voltage or some other bias voltage less than or greater than the positive power supply voltage. Line 72-1b may be a conductive routing path having a first terminal (a first distal end) coupled to ground line 74 and having a second terminal (a second distal end) coupled to a first input terminal of amplifier 60-2 via an optional series transmission line 92-1.

Lines 72-1a and 72-1b may be routed parallel to each another. Although drawn as straight lines in the example of FIG. 7, lines 72-1a and 72-1b need not be completely straight and can have one or more turns, can be curved, can be routed vertically and/or horizontally across the surface of an integrated circuit chip, and/or can form a routing path with any desired shape. Lines 72-1a and 72-1b can have the same footprint. Line 72-1b should generally be routed along or follow line 72-1a and therefore has the same or similar length as line 72-1a. The amount of capacitive coupling between lines 72-1a and 72-1b can be maximized by forming them close to each other. By strongly coupling lines 72-1a and 72-1b to each other, the pair of coupled lines are weakly coupled to neighboring passive components. Lines 72-1a and 72-1b can be fairly long. As examples, lines 72-1a and 72-1b can each be at least 50 microns in length, 50-100 microns in length, 100-200 microns in length, 200-400 microns in length, or more than 400 microns long. Conductive lines 72-1a and 72-1b that are routed close to and alongside each other are sometimes referred to collectively and defined as "coupled lines" or a pair of coupled lines.

Line 72-2a may be a conductive routing path having a first terminal (a first distal end) coupled to a second output terminal of amplifier 60-1 via an optional series transmission line 90-2 and having a second terminal (a second distal end) coupled to bias voltage line 76. The first and second output terminals of amplifier 60-1 may serve collectively as the differential output port of amplifier 60-1. Line 72-2b may be a conductive routing path having a first terminal (a first distal end) coupled to ground line 74 and having a second terminal (a second distal end) coupled to a second input terminal of amplifier 60-2 via an optional series transmission line 92-2. The first and second input terminals of amplifier 60-2 may serve collectively as the differential input port of amplifier 60-2.

Lines 72-2a and 72-2b may be routed parallel to each another. Although drawn as straight lines in the example of FIG. 7, lines 72-2a and 72-2b need not be completely straight and can have one or more turns, can be curved, can be routed vertically and/or horizontally across the surface of an integrated circuit chip, and/or can form a routing path with any desired shape. Lines 72-2a and 72-2b can have the same footprint. Line 72-2b should generally be routed along or follow line 72-2a and therefore has the same or similar length as line 72-2a. The amount of capacitive coupling between lines 72-2a and 72-2b can be maximized by forming them close to each other. By strongly coupling lines 72-2a and 72-2b to each other, the pair of coupled lines are weakly coupled to neighboring passive components. Lines 72-2a and 72-2b can be fairly long. As examples, lines 72-2a and 72-2b can each be at least 50 microns in length, 50-100 microns in length, 100-200 microns in length, 200-400 microns in length, or more than 400 microns long. Conductive lines 72-2a and 72-2b that are routed close to and alongside each other are sometimes referred to collectively and defined as "coupled lines" or a pair of coupled lines.

Series transmission lines 90-1 and 90-2 (sometimes referred to collectively as a differential transmission line 90) coupled between the output of first amplifier 60-1 and differential coupled lines 70 is optional (e.g., differential line 90 can be omitted). Differential line 90 may be shorter or longer than differential coupled lines 70. Similarly, transmission lines 92-1 and 92-2 coupled between differential coupled line 70 and the input of second amplifier 60-2 is optional (e.g., differential transmission line 92 can be omitted, if desired). Differential line 92 may be shorter or longer than differential coupled lines 70.

In the example of FIG. 7, differential transmission lines 90 can be coupled between the first amplifier stage and differential coupled lines 70, whereas differential transmission lines 92 can be coupled between the differential coupled lines 70 and the second amplifier stage. As another example, the first amplifier stage can be directly connected to differential coupled lines 70 (e.g., lines 90-1 and 90-2 are omitted), whereas differential transmission lines 92 can be coupled between the differential coupled lines 70 and the second amplifier stage. As another example, differential transmission lines 90 can be coupled between the first amplifier stage and differential coupled lines 70, whereas differential coupled lines 70 can be directly connected to the second amplifier stage (e.g., lines 92-1 and 92-2 are omitted). As yet another example, the first amplifier stage can be directly connected to differential coupled lines 70 (e.g., lines 90-1 and 90-2 are omitted), differential coupled lines 70 can be directly connected to the second amplifier stage (e.g., lines 92-1 and 92-2 are also omitted).

In these various combinations, the differential coupled lines 70 and/or the series transmission lines 90/92 (if used) can be designed and configured (e.g., by selecting the length, width, shape, footprint, and other physical characteristics of these conductive paths) to provide the requisite routing and proper impedance matching between the two amplifiers 60-1 and 60-2 to ensure minimal power/signal loss. Using only differential coupled lines 70 and optionally differential lines 90 and 92 to provide both routing and matching functions obviates the need for matching transformers, which can dramatically reduce circuit area that would otherwise be occupied by the matching transformers while also providing improved flexibility for connecting amplifier 60-1 to amplifier 60-2, the locations of which are sometimes dictated by strict floorplan constraints.

Figure 8:
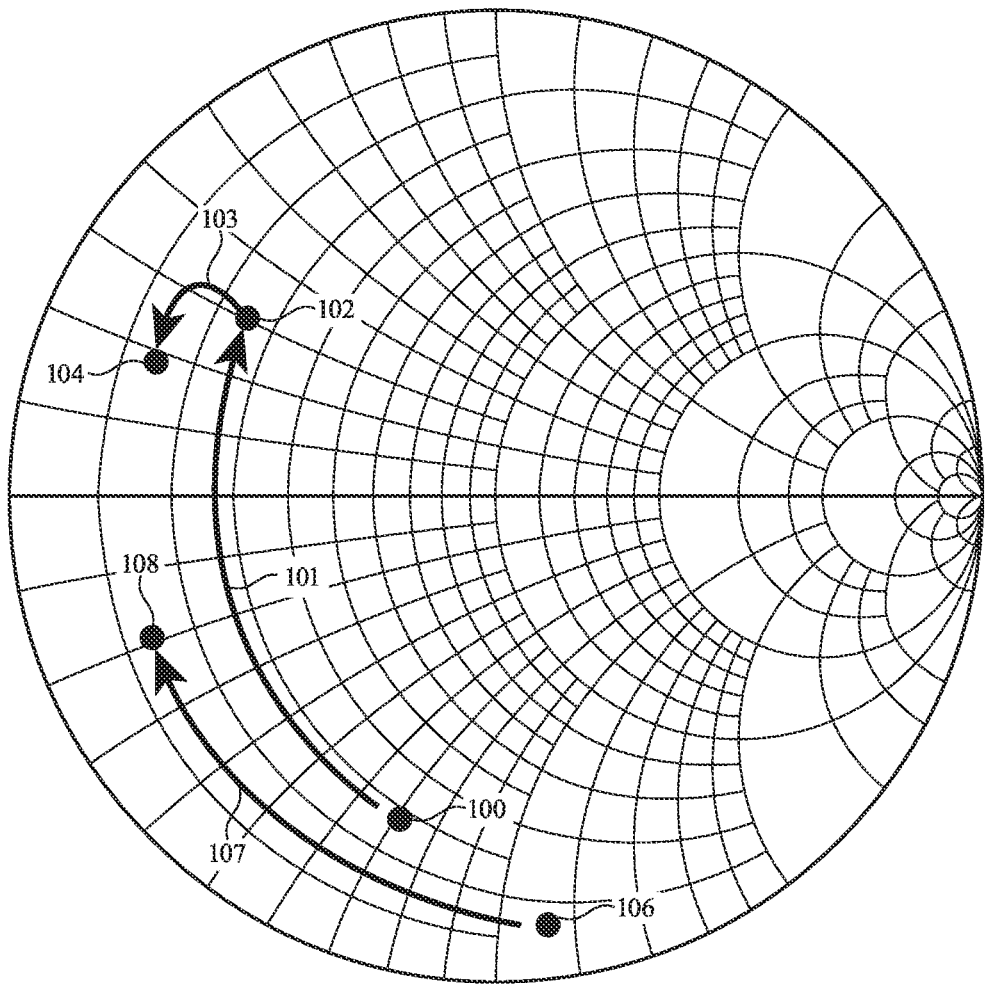
FIG. 8 is a Smith chart illustrating how an output impedance of the first amplifier of FIG. 7 can be matched to an input impedance of the second amplifier using differential coupled lines and differential transmission lines in accordance with some embodiments.

FIG. 8 is a Smith chart illustrating how differential lines 90, 70, and 92 of the type shown in FIG. 7 can be configured to provide interstage matching for amplifiers 60-1 and 60-2. In FIG. 8, point 100 may represent the impedance at the output port of the first amplifier stage 60-1. Differential lines 90 may, for example, transform the impedance at the output port of the first amplifier stage from point 100 to point 102 in a low-Q region of the Smith chart, as shown by arrow 101. Differential coupled lines 70 may then transform the resulting impedance from point 102 to point 104, as shown by arrow 103. On the other hand, point 106 may represent the impedance at the input port of the second amplifier stage 60-2. Differential lines 92 may, for example, transform the impedance at the input port of the second amplifier stage from point 106 to point 108 in the low-Q region of the Smith chart, as shown by arrow 107. Translating the input/output impedances of the two amplifiers using differential lines 90 and 92 to low-Q regions of the Smith chart can help facilitate wide bandwidth impedance matching. Operated in this way, the new low-Q impedance at point 104 will be conjugate matched with the new low-Q impedance at point 108. The example of FIG. 8 is illustrative. In general, differential coupled lines 70 and one or more associated sets of differential lines can be used to provide the desired interstage matching between two amplifier stages.

Figure 9:
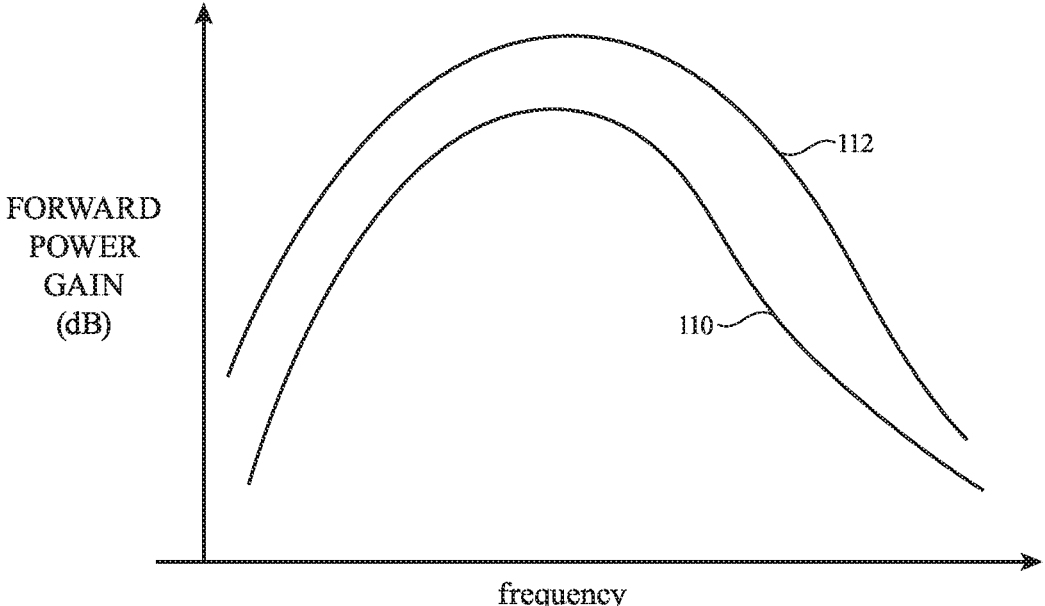
FIG. 9 is a diagram plotting forward voltage gain as a function of frequency comparing different impedance matching circuits in accordance with some embodiments.

FIG. 9 is a diagram plotting a forward power gain as a function of frequency comparing different impedance matching circuits. The forward power gain on the y-axis of the plot may represent an S(2,1) parameter expressed in decibels. In FIG. 9, curve 110 may represent the S(2,1) curve for a conventional transmission path between two amplifier stages that includes a differential 100 ohm transmission line with multiple transformers for impedance matching. On the other hand, curve 112 represents the S(2,1) curve for an arrangement such as that shown in FIG. 7 that includes differential coupled lines 70 with one or more series differential lines 90 and 92, all of which can be used for routing and impedance matching purposes. As shown in FIG. 9, the forward power gain for the differential coupled lines approach associated with curve 112 is greater than the conventional transformer-based approach associated with curve 110 across a wide range of operating frequencies. In other words, the use of differential coupled lines to replace transformers for impedance matching can help reduce matching/power loss.

Figure 10:
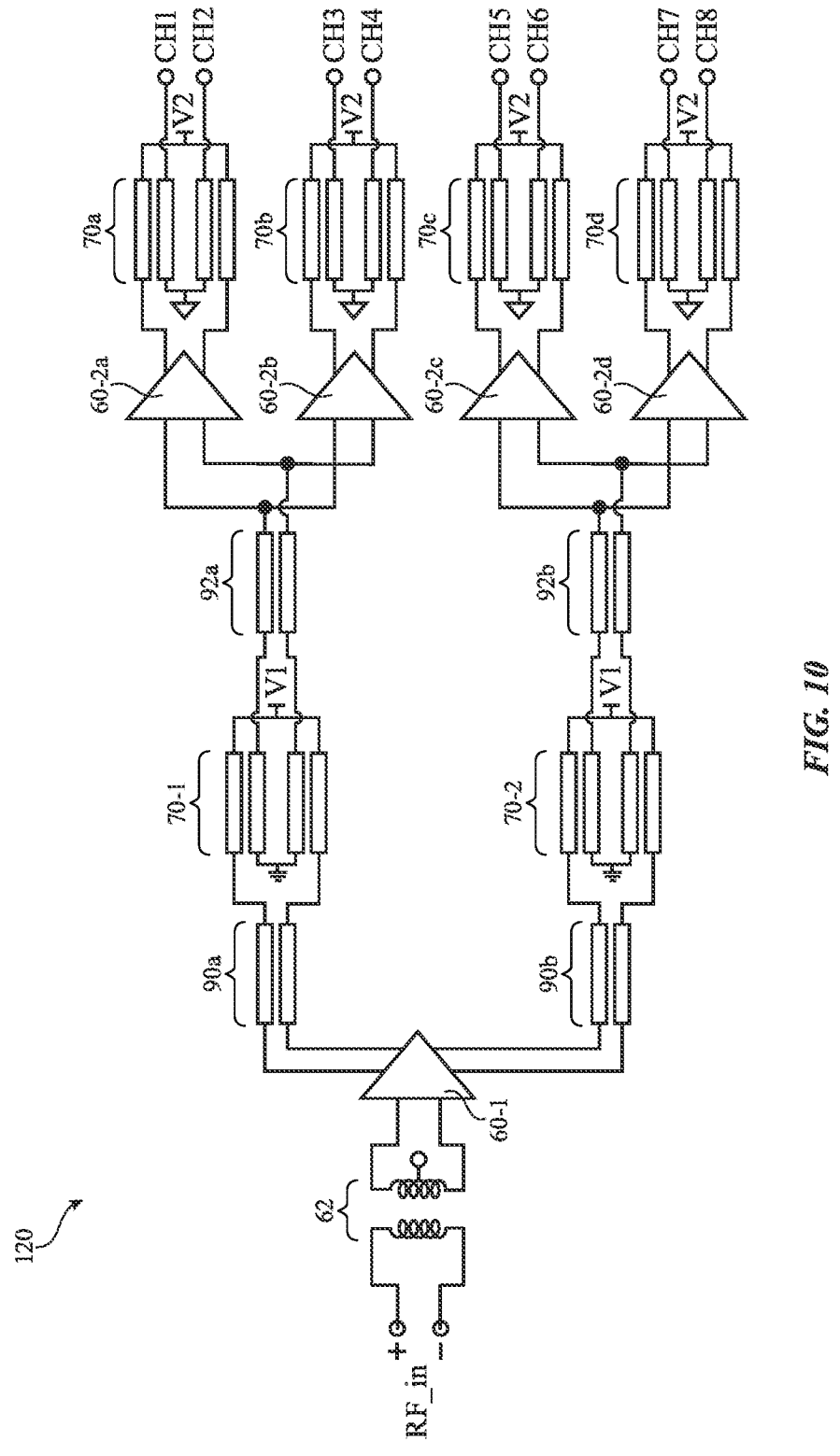
FIG. 10 is diagram of illustrative active signal divider circuitry formed using differential coupled lines in accordance with some embodiments.

The differential coupled lines of the type described in connection with FIGS. 3, 4, and 7 can be used in a wide range of radio-frequency applications. FIG. 10 is a diagram showing an active splitter circuit such as active splitter 120 that can be implemented using differential coupled lines. As shown in FIG. 10, active splitter 120 (sometimes referred to as an active power divider) may include an input transformer configured to receive a radio-frequency input signal RF_in, a first amplifier stage including amplifier 60-1 and a second amplifier stage including amplifiers 60-2a, 60-2b, 60-2c, and 60-2d. Amplifier 60-1 may have an output coupled to a first set of differential coupled lines 70-1 via series differential lines 90a. Differential coupled lines 70-1 may split off in a 1:2 fanout fashion to couple with amplifiers 60-2a and 60-2b via series differential lines 92a. Amplifier 60-2a may be coupled to at least a first channel CH1 and a second channel CH2 via a second set of differential coupled lines 70a. Similarly, amplifier 60-2b may be coupled to at least a third channel CH3 and a fourth channel CH4 via a third set of differential coupled lines 70b.

Amplifier 60-1 may also be coupled to a fourth set of differential coupled lines 70-2 via series differential lines 90b. Differential coupled lines 70-2 may split off in a 1:2 fanout fashion to couple with amplifiers 60-2c and 60-2d via series differential lines 92b. Amplifier 60-2c may be coupled to at least a fifth channel CH5 and a sixth channel CH6 via a fifth set of differential coupled lines 70c. Similarly, amplifier 60-2d may be coupled to at least a seventh channel CH7 and an eighth channel CH8 via a sixth set of differential coupled lines 70d. The various channels CH1-CH8 can represent different channels for a phased antenna array (as an example). In such scenarios, each channel may include a respective power amplifier, phase shifter, and other radio-frequency components for driving a respective antenna in the phased array. The use of series differential lines 90a, 92a, 90b, and 92b are optional.

In the example of FIG. 10, differential coupled lines 70-1 and 70-2 coupled between the two amplifier stages may be configured to receive bias voltage V1, whereas the differential coupled lines 70a, 70b, 70c, and 70d coupled to the output of the second amplifier stage may be configured to receive bias voltage V2. Bias voltages V1 and V2 can be the same or can be different. As an example, bias voltage V1 might be greater than bias voltage V2. As another example, bias voltage V1 might be less than bias voltage V2. If desired, the bias voltages for all of the different sets of differential coupled lines can be slightly different.

The example of FIG. 10 showing a 1:8 active power splitter 120 is illustrative. If desired, a 1:2, 1:4, 1:16, or 1:32 active power splitter (divider) can be implemented in a similar fashion. The use of differential coupled lines for routing and impedance matching is not limited to active power divider architectures for a transmit path. If desired, an active power combiner can also be implemented using multiple sets of differential coupled lines. As examples, a 2:1, 4:1, 8:1, 16:1, or 32:1 active power combiner can be implemented for a phased antenna array in a receive path. For instance, an 8:1 active combiner can be implemented by reversing the direction of the amplifiers shown in FIG. 10. The use of differential coupled lines for routing and impedance matching is also not limited to radio-frequency signals. If desired, differential coupled lines can also be used to connect and match circuits conveying intermediate frequency (IF) signals and/or baseband signals.

The methods and operations described above in connection with FIGS. 1-10 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Circuitry comprising:
a first amplifier; and
differential coupled lines having
a first pair of coupled lines connected to a first output terminal of the first amplifier, wherein the first pair of coupled lines includes a first conductive path having a first end coupled to the first output terminal and a second end coupled to a bias voltage line and a second conductive path routed along the first conductive path and having a first end directly connected to a ground line, and
a second pair of coupled lines connected to a second output terminal of the first amplifier, wherein the second pair of coupled lines includes a third conductive path having a first end coupled to the second output terminal and a second end coupled to the bias voltage line and a fourth conductive path, separate from the second conductive path, routed along the third conductive path and having a first end directly connected to the ground line.

2. The circuitry of claim 1, wherein the first end of the first conductive path is directly connected to the first output terminal of the first amplifier and wherein the first end of the third conductive path is directly connected to the second output terminal of the first amplifier.

3. The circuitry of claim 1, further comprising a transformer directly connected to an input of the first amplifier.

4. The circuitry of claim 1, further comprising a differential line directly connected to an input of the first amplifier.

5. The circuitry of claim 1, wherein the second and fourth conductive paths have second ends coupled to one or more antennas.

6. The circuitry of claim 1, further comprising a second amplifier configured to receive a signal via the differential coupled lines.

7. The circuitry of claim 6, wherein the second amplifier includes:
a first input terminal coupled to a second end of the second conductive path; and
a second input terminal coupled to a second end of the fourth conductive path.

8. The circuitry of claim 7, further comprising:
a first differential transmission line coupled between the first amplifier and the differential coupled lines; and
a second differential transmission line coupled between the differential coupled lines and the second amplifier.

9. The circuitry of claim 7, further comprising:
a differential transmission line coupled between the first amplifier and the differential coupled lines or between the differential coupled lines and the second amplifier.

10. The circuitry of claim 7, wherein the differential coupled lines are configured to provide impedance matching between the first and second amplifiers.

11. The circuitry of claim 1, wherein the differential coupled lines are configured to provide impedance matching at the first and second output terminals of the first amplifier.

12. The circuitry of claim 1, wherein the first pair of coupled lines comprise edge-coupled strip lines, edge-coupled coplanar waveguides, or a broadside-coupled strip lines.

13. The circuitry of claim 1, further comprising:

additional differential coupled lines having a third pair of coupled lines connected to a third output terminal of the first amplifier and a fourth pair of coupled lines connected to a fourth output terminal of the first amplifier.

14. The circuitry of claim 13, further comprising:

first differential lines coupled between the first output terminal and the first pair of coupled lines;

second differential lines coupled between the second output terminal and the second pair of coupled lines;

third differential lines coupled between the third output terminal and the third pair of coupled lines; and fourth differential lines coupled between the fourth output terminal and the fourth pair of coupled lines.

15. The circuitry of claim 14, further comprising:

a second amplifier having an input coupled to the differential coupled lines; and a third amplifier having an input coupled to the additional differential coupled lines.

16. The circuitry of claim 15, further comprising:

a fourth amplifier having an input coupled to the differential coupled lines; and a fifth amplifier having an input coupled to the additional differential coupled lines.

17. The circuitry of claim 16, further comprising:

fifth differential lines having a first end coupled to the differential coupled lines and a second end coupled to the second and fourth amplifiers; and sixth differential lines having a first end coupled to the additional differential coupled lines and a second end coupled to the third and fifth amplifiers.

18. The circuitry of claim 17, wherein:

the second amplifier has outputs coupled to a first pair of antennas;

the third amplifier has outputs coupled to a second pair of antennas;

the fourth amplifier has outputs coupled to a third pair of antennas; and the fifth amplifier has outputs coupled to a fourth pair of antennas.

19. A method of operating circuitry, comprising:

with a first amplifier, outputting radio-frequency signals at first and second output terminals of the first amplifier;

with a first conductive path having a first end coupled to the first output terminal and a second end coupled to a bias voltage line, conveying a first portion of the radio-frequency signals;

with a second conductive path routed along the first conductive path and having a first end directly connected to a ground line, conveying the first portion of the radio-frequency signals;

with a third conductive path having a first end coupled to the second output terminal and a second end coupled to the bias voltage line, conveying a second portion of the radio-frequency signals; and with a fourth conductive path separate from the second conductive path, routed along the third conductive path, and having a first end directly connected to the ground line, conveying the second portion of the radio-frequency signals.

20. The method of claim 19, further comprising:

with the first and second conductive paths, providing impedance matching at the first output terminal; and with the third and fourth conductive paths, providing impedance matching at the second output terminal.

21. The method of claim 19, further comprising:

with a second amplifier, receiving the radio-frequency signals via the first, second, third, and fourth conductive paths, wherein the second amplifier has a first input coupled to a second end of the second conductive path and a second input coupled to a second end of the fourth conductive path.

22. The method of claim 19, further comprising:

with a third amplifier, receiving the radio-frequency signals via the first, second, third, and fourth conductive paths.

23. The method of claim 22, further comprising:

with the second amplifier, outputting radio-frequency signals to a first set of antennas; and with the third amplifier, outputting radio-frequency signals to a second set of antennas.

24. The method of claim 19, further comprising:

with the first amplifier, outputting radio-frequency signals at third and fourth output terminals of the first amplifier;

with a fifth conductive path having a first end coupled to the third output terminal and a second end coupled to the bias voltage line, conveying a third portion of the radio-frequency signals;

with a sixth conductive path routed along the fifth conductive path and having a first end directly connected to the ground line, conveying the third portion of the radio-frequency signals;

with a seventh conductive path having a first end coupled to the fourth output terminal and a second end coupled to the bias voltage line, conveying a fourth portion of the radio-frequency signals; and with an eighth conductive path routed along the seventh conductive path and having a first end directly connected to the ground line, conveying the fourth portion of the radio-frequency signals.

25. The method of claim 24, further comprising:

with a second amplifier, receiving the first and second portions of the radio-frequency signals via the first, second, third, and fourth conductive paths, wherein the second amplifier has a first input coupled to a second end of the second conductive path and a second input coupled to a second end of the fourth conductive path; and with a third amplifier, receiving the third and fourth portions of the radio-frequency signals via the fifth, sixth, seventh, and eighth conductive paths, wherein the third amplifier has a first input coupled to a second end of the sixth conductive path and a second input coupled to a second end of the eighth conductive path.

\* \* \* \* \*